(12) United States Patent
Kurth et al.

(10) Patent No.: US 6,410,385 B2
(45) Date of Patent: Jun. 25, 2002

(54) ROM-EMBEDDED-DRAM

(75) Inventors: Casey R. Kurth, Eagle; Scott J. Derner, Meridian; Patrick J. Mullarkey, Meridian, all of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/833,706

(22) Filed: Apr. 13, 2001

Related U.S. Application Data

(62) Division of application No. 09/559,832, filed on Apr. 28, 2000, now Pat. No. 6,243,285, which is a division of application No. 09/127,042, filed on Jul. 31, 1998, now Pat. No. 6,134,137.

(51) Int. Cl.[7] ...................... H01L 21/8242; H01L 21/44
(52) U.S. Cl. .................. 438/253; 438/599; 438/669
(58) Field of Search ................. 438/253, 597, 438/598, 694, 697, 758, 761, 700, 626, 669, 672; 365/149

(56) References Cited

U.S. PATENT DOCUMENTS

| | | | | |
|---|---|---|---|---|
| 5,144,579 A | * | 9/1992 | Okabe et al. | 365/149 |
| 5,148,391 A | | 9/1992 | Zagar | 365/96 |
| 5,270,241 A | | 12/1993 | Dennison | 437/52 |
| 5,418,739 A | | 5/1995 | Takasugi | 365/149 |
| 5,801,443 A | * | 9/1998 | Ohno | 257/758 |
| 5,995,409 A | | 11/1999 | Holland | 364/149 |
| 6,025,247 A | * | 2/2000 | Chang et al. | 438/396 |
| 6,060,351 A | * | 5/2000 | Parekh et al. | 438/253 |

* cited by examiner

*Primary Examiner*—Richard Elms
*Assistant Examiner*—Adam Pyonin
(74) *Attorney, Agent, or Firm*—Dickstein Shapiro Morin & Oshinsky

(57) ABSTRACT

A ROM is embedded within an array of DRAM cells by changing a single mask in a DRAM fabrication process to selectively short circuit the DRAM capacitor lower electrode to its own wordline to create a read-only "1" or to the wordline of an adjacent cell to create a read only "0".

16 Claims, 21 Drawing Sheets

ROM-EMBEDDED-DRAM

FIELD OF THE INVENTION

This application is a divisional of U.S. patent application Ser. No. 09/559,832, filed Apr. 28, 2000, now U.S. Pat. No. 6,243,285 B1, which is a divisional of U.S. patent application Ser. No. 09/127,042, filed Jul. 31, 1998, now U.S. Pat. No. 6,134,137. Each of the above is entitled ROM-EMBEDDED-DRAM and the entirety of both is hereby incorporated by reference.

BACKGROUND OF THE INVENTION

Semiconductor memory systems are comprised of two basic elements: memory storage areas and memory control areas. DRAM, for example, includes a memory cell array, which stores information, and peripheral circuitry, which controls the operation of the memory cell array.

DRAM arrays are manufactured by replicating millions of identical circuit elements, known as DRAM cells, on a single semiconductor wafer. A DRAM cell is an addressable location that can store one bit (binary digit) of data. In its most common form, a DRAM cell consists of two circuit components: a storage capacitor and an access field effect transistor.

FIG. 1 illustrates a portion of a DRAM memory circuit containing two neighboring DRAM cells 10. For each cell, one side of the storage capacitor 14 is connected to a reference voltage, which is typically one half of the internal operating voltage (the voltage corresponding to a logical "1" signal) of the circuit. The other side of the storage capacitor 14 is connected to the drain of the access field effect transistor 12. The gate of the access field effect transistor 12 is connected to a signal referred to as the wordline 11. The source of the field effect transistor 12 is connected to a signal referred to as the bit line 15. With the circuit connected in this manner, it is apparent that the wordline controls access to the storage capacitor 14 by allowing or preventing the signal (a logic "0" or a logic "1") on the bit line 15 to be written to or read from the storage capacitor 14.

The manufacturing of a DRAM cell includes the fabrication of a transistor, a capacitor, and three contacts: one each to the bit line, the wordline, and the reference voltage. DRAM manufacturing is a highly competitive business. There is continuous pressure to decrease the size of individual cells and increase memory cell density to allow more memory to be squeezed onto a single memory chip. However, it is necessary to maintain a sufficiently high storage capacitance to maintain a charge at the refresh rates currently in use even as cell size continues to shrink. This requirement has led DRAM manufacturers to turn to three dimensional capacitor designs, including trench and stacked capacitors. Stacked capacitors are capacitors which are stacked, or placed, over the access transistor in a semiconductor device. In contrast, trench capacitors are formed in the wafer substrate beneath the transistor. For reasons including ease of fabrication and increased capacitance, most manufacturers of DRAMs larger than 4 Megabits use stacked capacitors. Therefore, the invention will be discussed in connection with stacked capacitors but should not be understood to be limited thereto. For example, use of the invention in connection with trench or planar capacitors is also possible.

One widely used type of stacked capacitor is known as a container capacitor. Known container capacitors are in the shape of an upstanding tube (cylinder) having an oval or circular cross section. The wall of the tube consists of two plates of conductive material such as doped polycrystalline silicon (referred to herein as polysilicon or poly) separated by a dielectric. The bottom end of the tube is closed, with the outer wall in contact with either the drain of the access transistor or a plug which itself is in contact with the drain. The other end of the tube is open (the tube is filled with an insulative material later in the fabrication process). The sidewall and closed end of the tube form a container; hence the name "container capacitor." Although the invention will be further discussed in connection with stacked container capacitors, the invention should not be understood to be limited thereto.

The peripheral circuitry communicates with and controls the storage operations of the memory cell array through interconnection layers (or interconnects) usually formed from aluminum or other metal. FIG. 2 is a block diagram of a DRAM including peripherial circuitry. Referring to FIG. 2, DRAM 50 comprises: a memory cell array 51 for storing data signals of memory information; a row and column address buffer 52 for receiving external address signals for selecting a memory cell; a row decoder 53 and a column decoder 54 for designating the memory cell by decoding the address signals; a sense refresh amplifier 55 for amplifying and reading a signal stored in the designated memory cell; a data-in buffer 56 and a data-out buffer 57 for inputting/outputting data; and a clock generator 58 for generating a clock signal.

Frequently, as in the case of microprocessors, microcontrollers, and other application specific integrated circuitry (ASICs), it is desired to incorporate ROM together with or in addition to RAM on a single semiconductor wafer. This typically requires the formation of separate additional peripheral circuitry and interconnects for the ROM. The ROM cells and additional circuitry require additional semiconductor wafer space and fabrication process steps which increase the overall costs of device fabrication.

The goal of increasing or, at least, maintaining memory capacity as cell size shrinks must be attained without resorting to processes that increase the number of masking, deposition, etch and other steps in the production process. This has a great impact on manufacturing costs, particularly the costs of photolithographic steps. High capital costs are associated with photolithographic equipment and more complex photo processing, in terms of more photo process steps per level, more equipment, and the use of expensive ultra clean room floor space. Defect density is inevitably increased with each additional photomasking layer and compromises yield and reliability. All photo layers also require a subsequent step, either implant or etch. These additional steps further add to manufacturing costs.

What is needed is a ROM-embedded-DRAM, for ASICs and the like, which can be fabricated with a minimum of process steps.

SUMMARY OF THE INVENTION

The present invention provides ROM-embedded-DRAM and a fabrication method in which a ROM is embedded within an array of DRAM cells. The ROM cells may be fabricated by changing a single mask in the DRAM fabrication process to selectively short circuit the DRAM capacitor lower electrode to its own wordline to create a read-only "1" or to the wordline of an adjacent cell to create a read only "0". The selective shorting may be achieved by shifting one mask opening, preferably the mask used for etching the opening for the capacitor storage node or plug. Shifting the mask either toward the desired read-only bit's wordline or the read-only bit's adjacent wordline programs the ROM bits, while the same mask openings on the DRAM cells are not changed. The ROM cells can use the same peripheral circuitry and interconnects as the DRAM cells on the same chip.

DETAILED DESCRIPTION OF THE PREFERRED EMBODIMENTS

The invention allows ROM to be included on a volume production DRAM part by only changing one mask for each ROM-embedded-DRAM chip design. The capacitor openings or the capacitor plug openings are shifted towards the desired read-only bit's wordline or towards the read-only bit's adjacent wordline to program the ROM bits, while the capacitor openings and capacitor plug openings on the DRAM cells are not changed. Since the density is higher than for normal DRAM and ROM mixed cell chips, the cost per bit is less, more information can be placed on the die, and system designs benefit from a reduced chip count.

Figure 1:
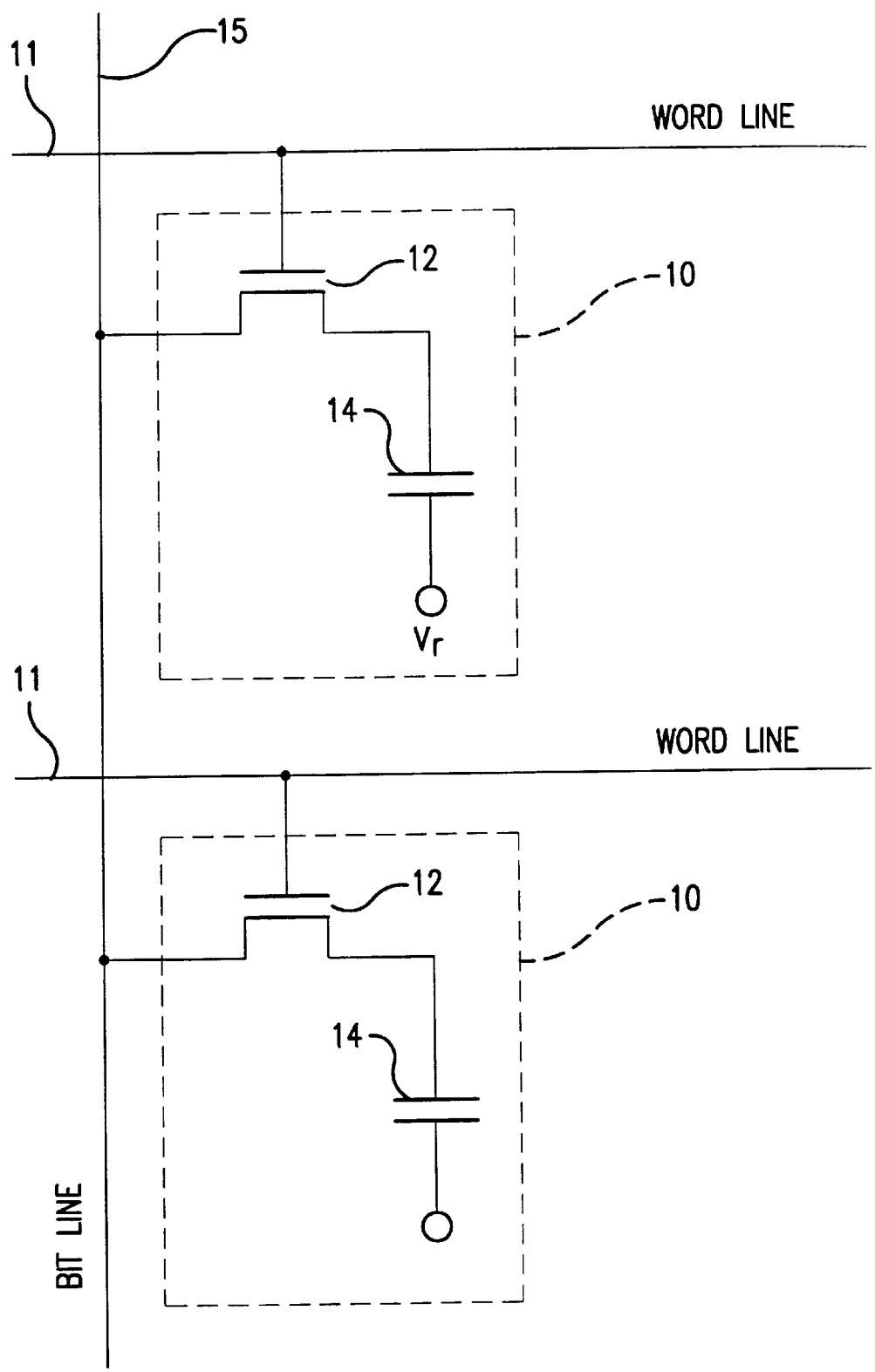
FIG. 1 is a circuit diagram of a portion of a conventional DRAM memory circuit.
Figure 2:
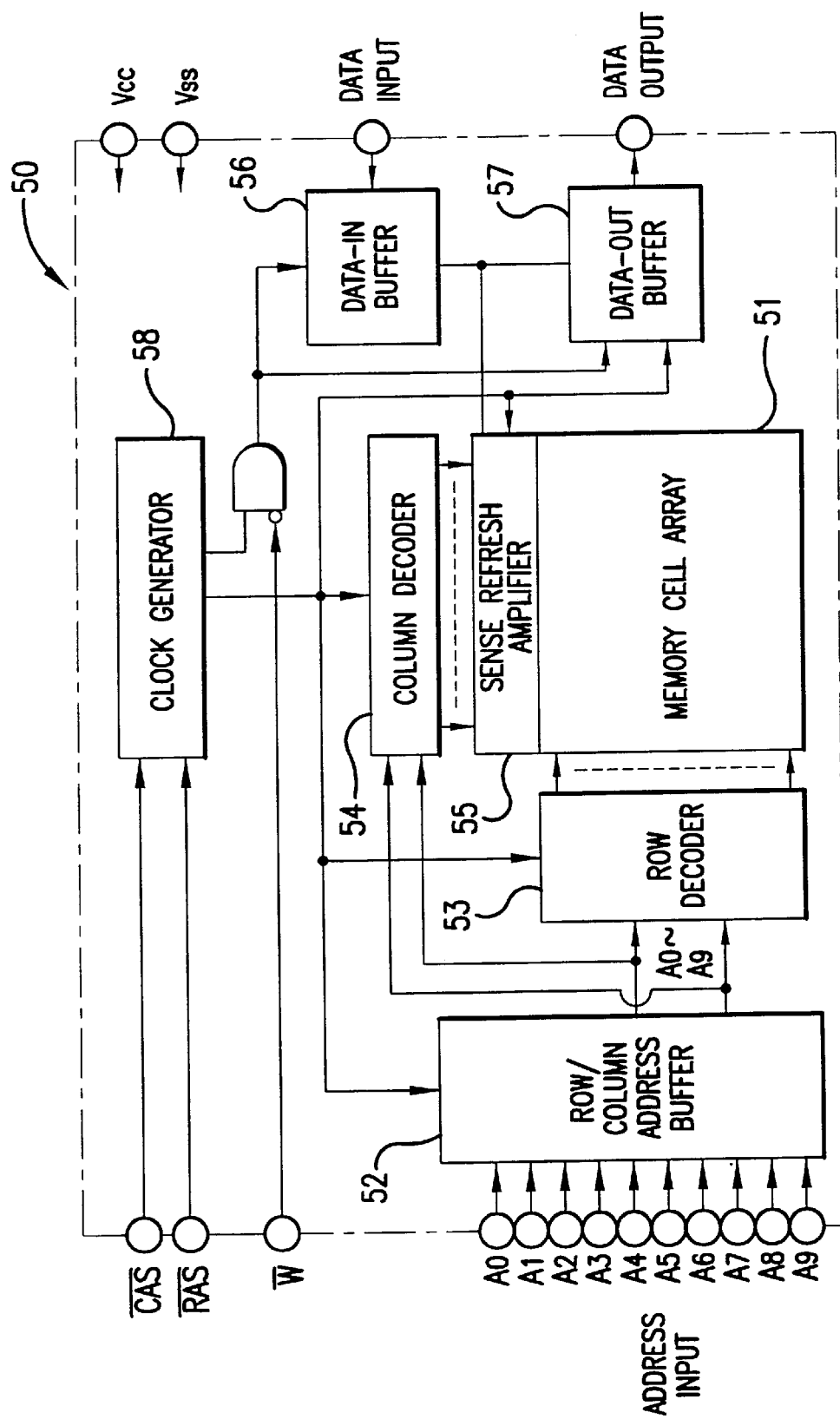
FIG. 2 is a block diagram showing a general structure of a DRAM.
Figure 3A:
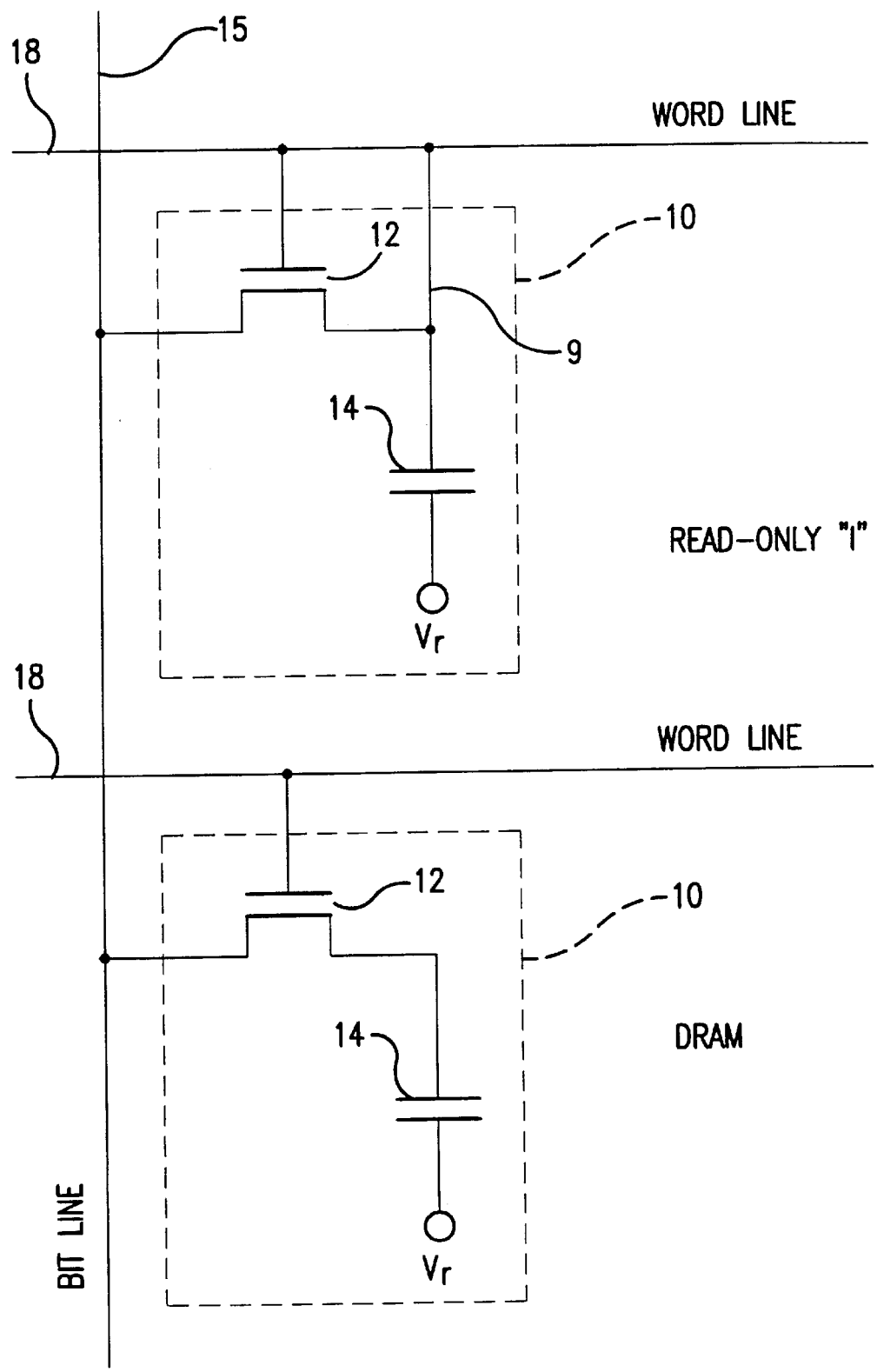
FIG. 3A is a circuit diagram of a portion of one embodiment of the ROM-embedded-DRAM of the invention. The ROM cell is programmed as a read-only "1".
Figure 3B:
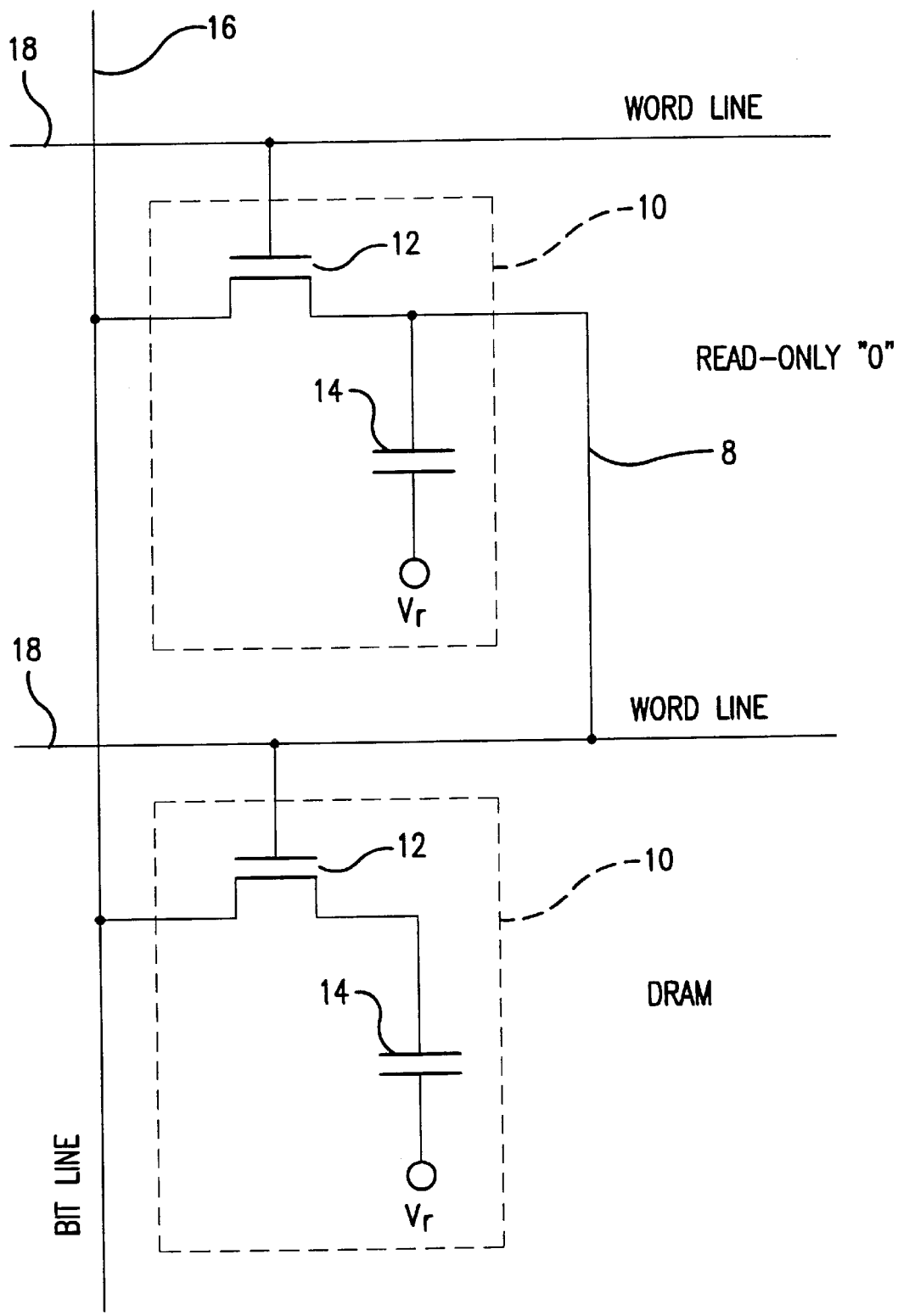
FIG. 3B is a circuit diagram of a portion of another embodiment of the ROM-embedded-DRAM of the invention. The ROM cell is programmed as a read-only "0".
Figure 3C:
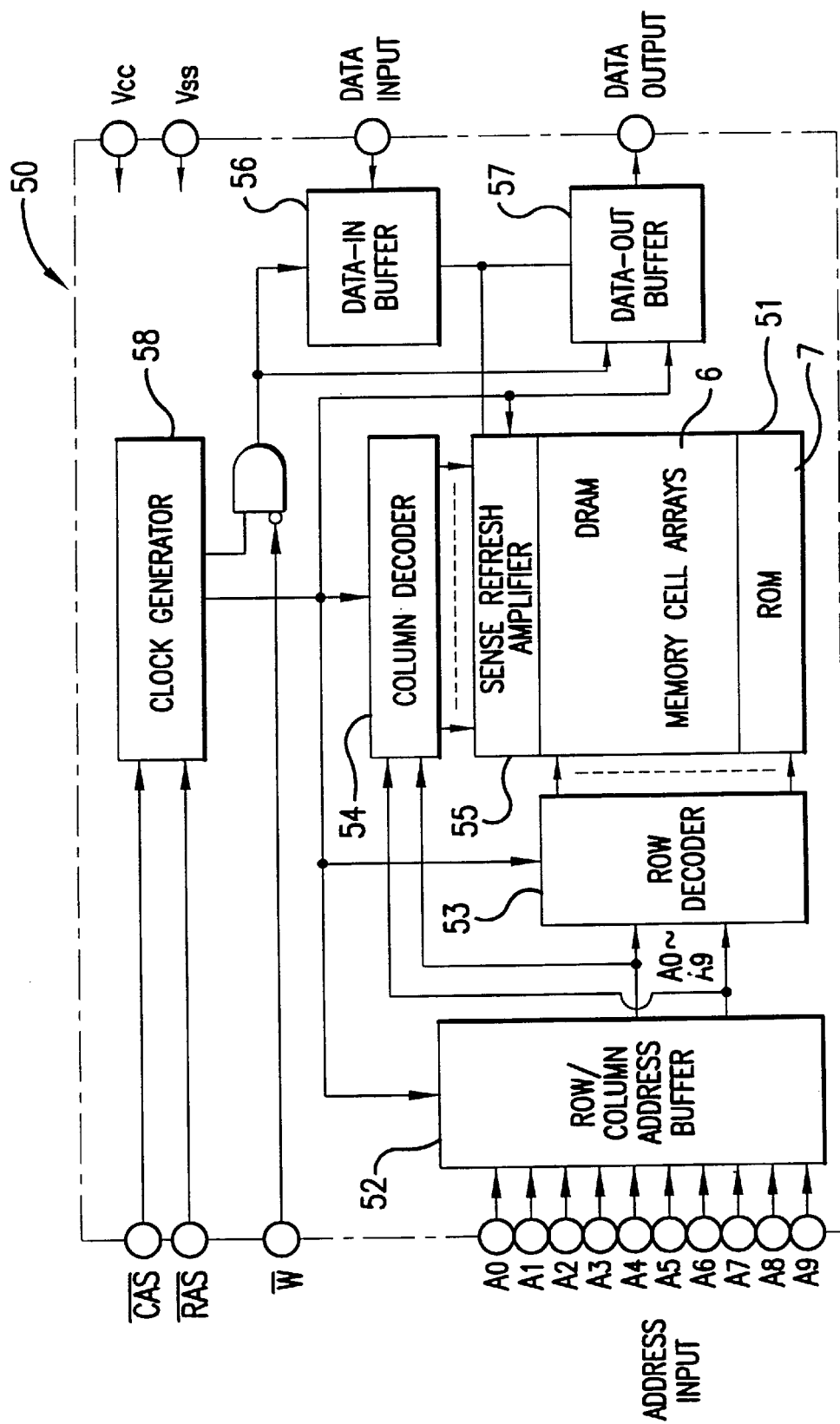
FIG. 3C is a block diagram showing another embodiment of the ROM-embedded-DRAM of the invention.

By shifting the mask for the capacitor opening or the capacitor plug opening, the future capacitor is short circuited to the wordline. As shown in the circuit diagram of FIG. 3A, when the capacitor is short circuited to the wordline of the memory cell, the resulting ROM cell is programmed as a read-only "1". As shown in FIG. 3B, when the capacitor is short circuited to the wordline of an adjacent cell, the resulting ROM cell is programmed as a read-only "0". This is so because the row line will turn on, going to VCC P (VCC +), to read the cell, while all other row lines remain off (ground). The remaining cells that are not programmed as ROM cells have DRAM circuit configurations as shown in FIGS. 1 and 3.

Figure 4B:
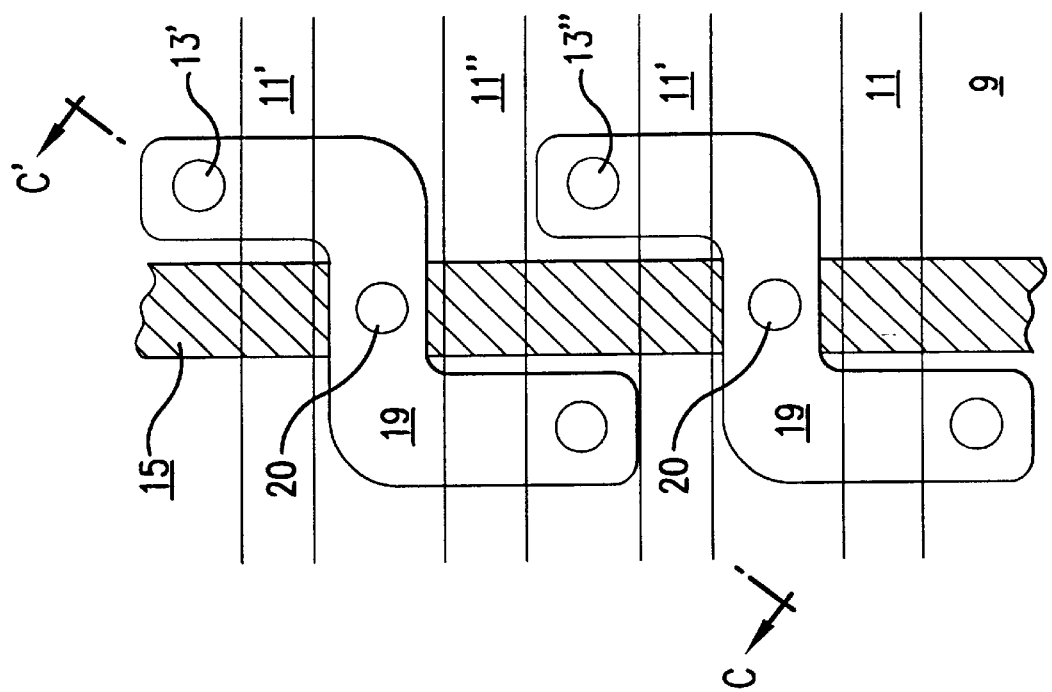
FIGS. 4A and B are schematic top plan layouts of ROM-embedded-DRAM memory cells according to the invention. The subsequent FIGS., which depict steps of the process of the invention, are cross-sectional views through location C-C' of the ROM-embedded-DRAM of FIG. 4B.
Figure 4A:
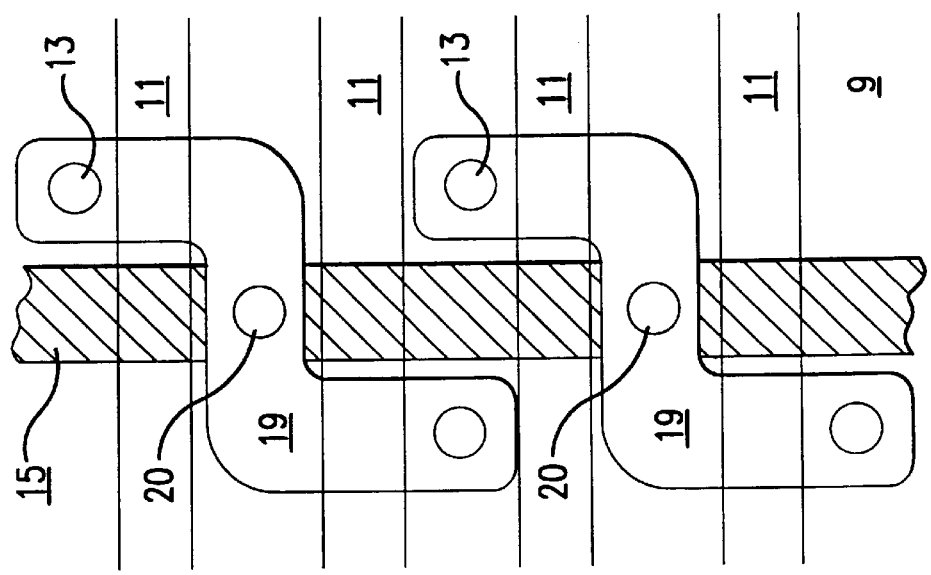

FIG. 4 depicts the shifting of capacitor plug openings to create the ROM-embedded-DRAM of the invention according to two different embodiments. With reference to FIG. 4A, corresponding to 4 DRAM cells, the completed DRAM array is fabricated on a silicon semiconductive substrate 9, typically a silicon semiconductive material. The term "substrate" herein shall be understood to mean one or more semiconductive layers or structures which include active or operable portions of semiconductor devices. A series of substantially parallel, spaced apart, polysilicon word lines 11, silicided with tungsten, titanium, or other refractory metal, traverses substrate 9, in which have been created a plurality of active areas 19 (the square S-shaped regions) which are insulated from one another by field oxide regions (not shown in this view). Each active area 19, which corresponds to the domain of a single memory cell, contains a storage node contact region or capacitor plug 13 where that cell's storage node capacitor plate makes contact to the substrate within the cell's domain. Each cell domain has a single bit line contact region 20. Each of the substantially parallel, spaced-apart bit lines 15 makes contact with a plurality of bit line contact regions 20. Eventually, the bit lines and word lines will be connected to periphery contacts (not shown), which are located at the respective ends of the array and are capable of being in electrical communication with peripheral circuitry.

With reference to FIG. 4B, the capacitor plug openings 13' and 13" have been shifted to make contact with, respectively, the wordline 11' of the same cell and the wordline 11" of an adjacent cell. The capacitors, in electrical contact with capacitor plugs within capacitor plug openings 13' and 13", are thus short circuited to word lines 11' and 11", respectively. As can be best seen with reference to FIGS. 3A and 3B, the resulting cells are now programmed as a read-only "1" and a read-only "0", respectively. Furthermore, a particularly advantageous feature of the invention is that the resulting ROM-embedded-DRAM can utilize the same peripheral circuitry as provided for the DRAM array (FIG. 3C), and can be fabricated by the same process steps with the exception of the shifted mask openings for those cells which are to be ROM.

An exemplary construction of a fabrication process for a ROM-embedded-DRAM according to one embodiment of the present invention is described below. It is to be understood, however, that this process is only one example of many possible processes. For example, the bit line is formed over the capacitor in the following process. A buried bit-line process could also be used. As another example, the plugs under the capacitors formed by the following process could be eliminated. Also, dry or wet etching could be used rather than chemical mechanical polishing. In addition, rather than shifting the mask openings for the capacitor plugs, it also is possible to fabricate the ROM cell, or adjacent cell, with word lines shifted closer to the capacitor plugs or capacitor storage nodes so as to short circuit the desired capacitors without making any shifts in the mask openings. The invention is not intended to be limited by the particular process described below.

Figure 5:
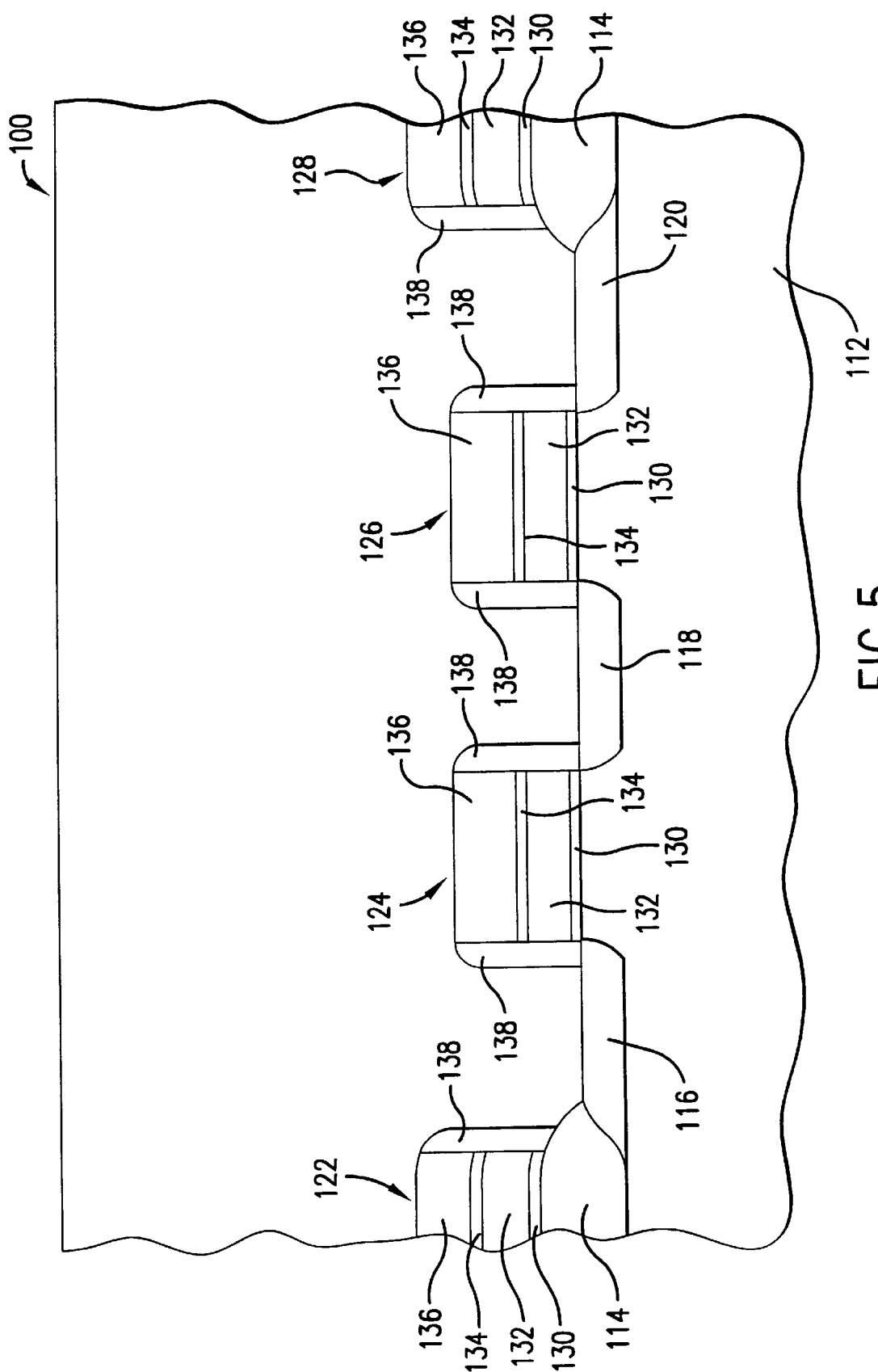
FIG. 5 is a diagrammatic cross-sectional view of a portion of a semiconductor wafer at an early processing step according to one embodiment of the present invention.

Referring now to FIG. 5, a semiconductor wafer cross section at an early processing step is indicated generally by reference numeral 100. The semiconductor wafer 100 is comprised of a bulk silicon substrate 112 with field isolation oxide regions 114 and active areas 116, 118, 120 formed therein. Word lines 122, 124, 126, 128 have been constructed on the wafer 100 in a conventional manner. Each wordline consists of a lower gate oxide 130, a lower poly layer 132, a higher conductivity silicide layer 134 and an insulating silicon nitride cap 136. Each wordline has also been provided with insulating spacers 138, which are also composed of silicon nitride.

Two FETs are depicted in FIG. 5. One FET is comprised of two active areas (source/drain) 116, 118 and one wordline (gate) 124. The second FET is comprised of two active areas (source/drain) 118, 120 and a second wordline (gate) 126. The active area 118 common to both FETs is the active area over which a bit line contact will be formed. As discussed above, one bit line contact is shared by two DRAM cells to conserve space.

Figure 6:
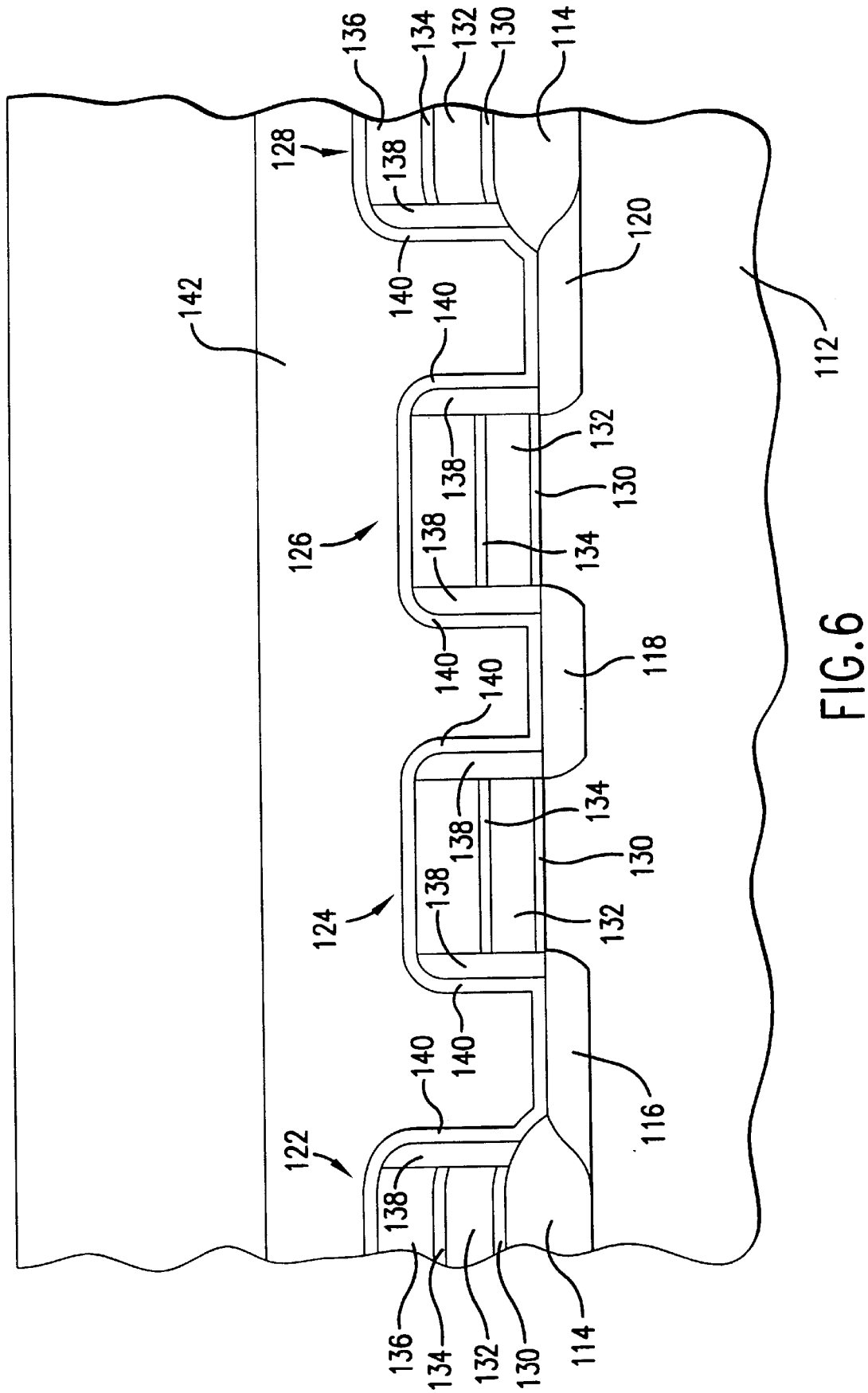
FIG. 6 is a diagrammatic cross-sectional view of a portion of a semiconductor wafer at a processing step subsequent to that shown in FIG. 5.

Referring now to FIG. 6, a thin layer 140 of nitride or TEOS (tetraethyl orthosilicate) is then provided atop the wafer 100. Next a layer of insulating material 142 is deposited. The insulating material preferably consists of borophosphosilicate glass (BPSG). The insulating layer 142 is subsequently planarized by chemical-mechanical polishing (CMP).

Figure 7:
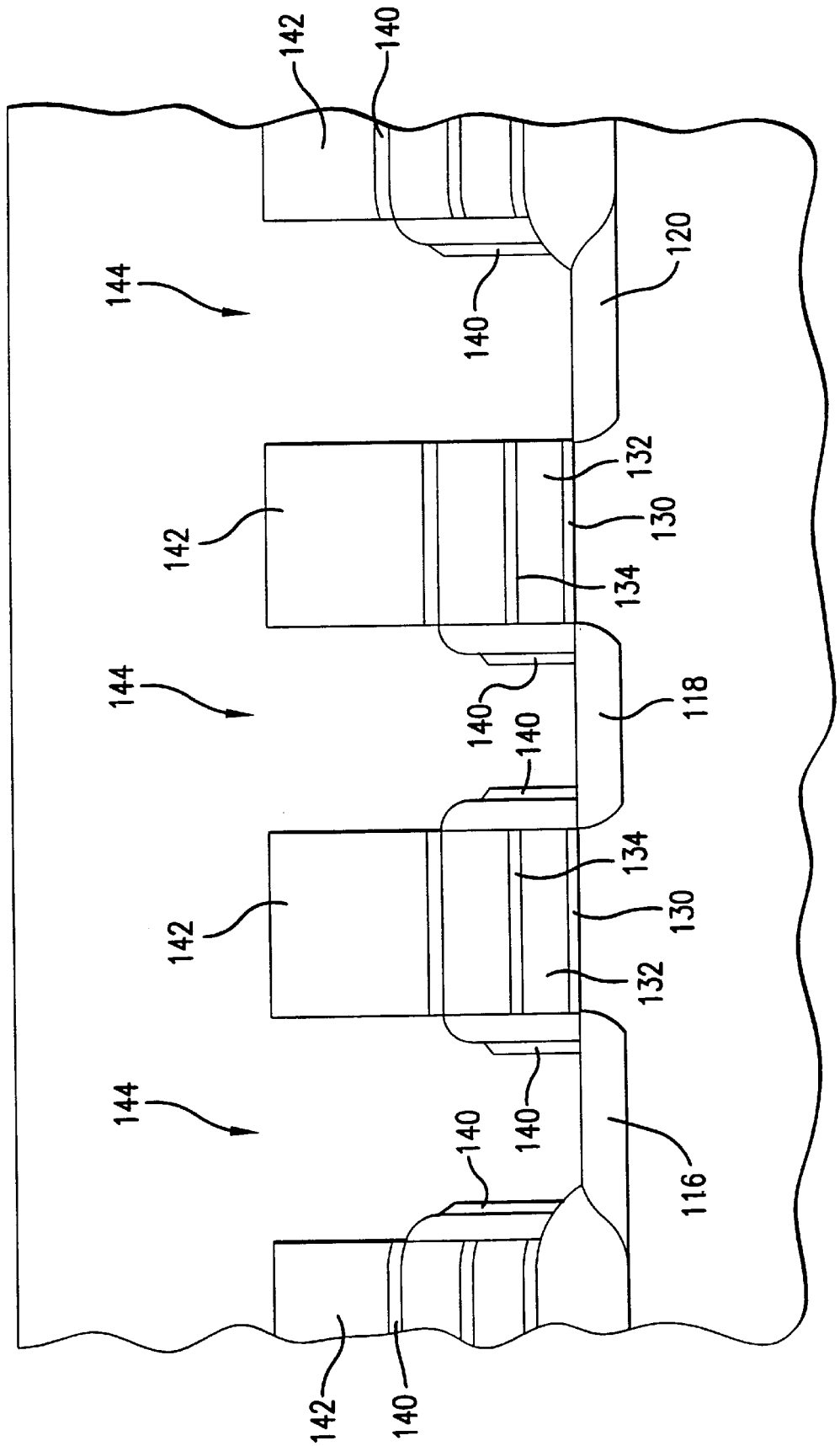
FIG. 7 is a diagrammatic cross-sectional view of a portion of a semiconductor wafer at a processing step subsequent to that shown in FIG. 6.

Referring now to FIG. 7, plug openings have been formed through the insulating layer 142. The plug openings 144 are formed through the insulating layer 142 by photomasking and dry chemical etching the BPSG, a portion of the thin nitride layer 140, and a nitride spacer 138 on one side above one or more of the active areas. More specifically, as shown in FIG. 7, the plug opening 144 over active area 120 is provided by shifting the corresponding plug opening mask to the left in the Figure, so that the left-side insulating spacer 138 is removed above active area 120. Similarly, the plug opening 144 over active area 116 may also be provided by shifting the corresponding mask to the left or to the right, so that the left-side, or right-side, respectively, insulating spacer 138 is removed over active area 116. The process of removing insulating layer 142, nitride layer 140, and spacers 138 can be performed by a selective or non-selective etch.

Preferably, the array geometry is such that the wordlines are sufficiently close together that a single mask and non-selective etch can be used to remove the insulating layer 142, nitride layer 140 and spacer 138. In other instances, a first mask and a nitride selective etch may be used to remove the insulating layer 142, and a second mask and non-selective etch may then be used to remove the nitride layer 140 and spacer 138.

As will be explained in more detail below, the cell containing active area 120 is now programmed as a read-only "1", whereas the cell with active area 116 is a DRAM cell. If the insulating spacer was removed on the left side of active area 116, this cell would be a read-only "0" as shown in FIG. 3B; if the right side insulating spacer above active area 116 was removed, this cell would also be a read-only "1" as shown in FIG. 3A. By removing spacer material 138, each such cell contains a wordline that is short circuited to the future capacitor.

Figure 8:
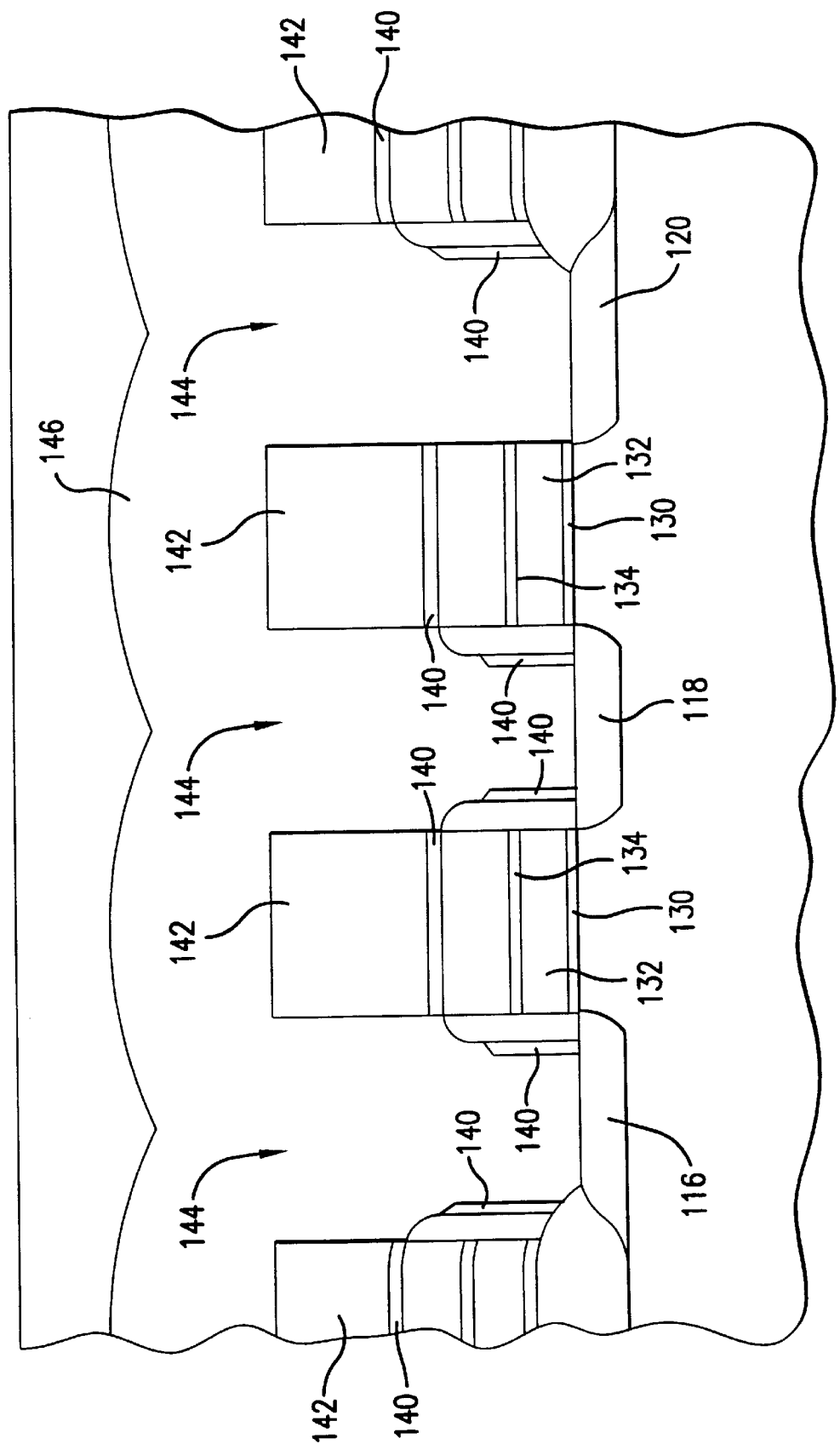
FIG. 8 is a diagrammatic cross-sectional view of a portion of a semiconductor wafer at a processing step subsequent to that shown in FIG. 7.

Referring now to FIG. 8, a layer 146 of conductive material is deposited to provide conductive material within the plug openings 144. The conductive plug layer 146 is in contact with the active areas 116, 118, 120. In addition, the conductive plug layer 146 above active area 120 is preferably also in contact with lower poly layer 132 and silicide layer 134 of the wordline. An example of the material used to form conductive plug layer 146 is in situ arsenic or phosphorous doped poly.

Figure 9:
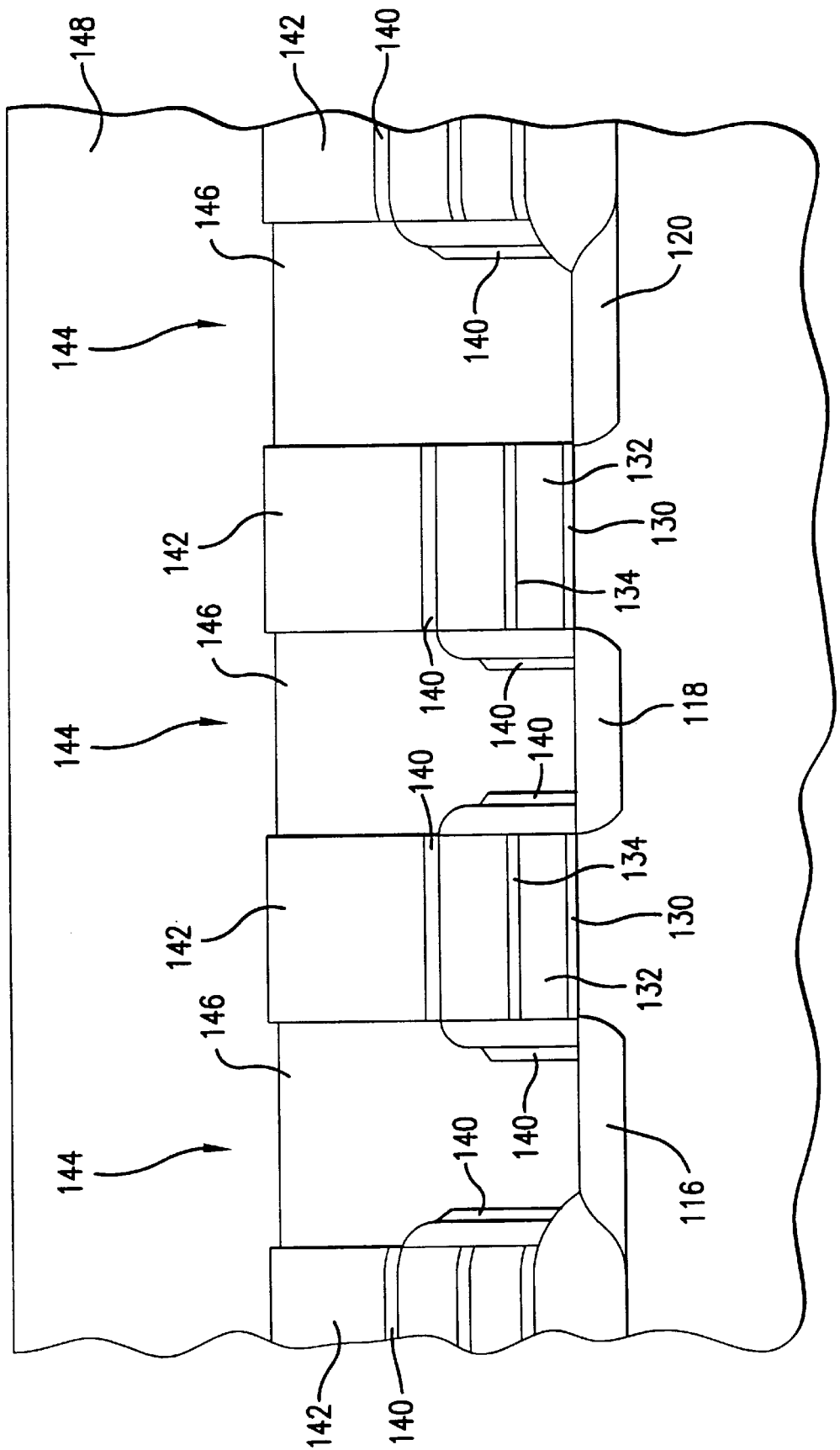
FIG. 9 is a diagrammatic cross-sectional view of a portion of a semiconductor wafer at a processing step subsequent to that shown in FIG. 8.

Referring now to FIG. 9, the conductive plug layer 146 is dry etched (or chemical-mechanical polished) to a point below the upper surface of the BPSG layer 142 such that the remaining material of the conductive plug layer 146 forms plugs 146 over the active areas 116, 118, 120. Still with reference to FIG. 9, an additional layer 148 of BPSG is then deposited on the structure.

Figure 10:
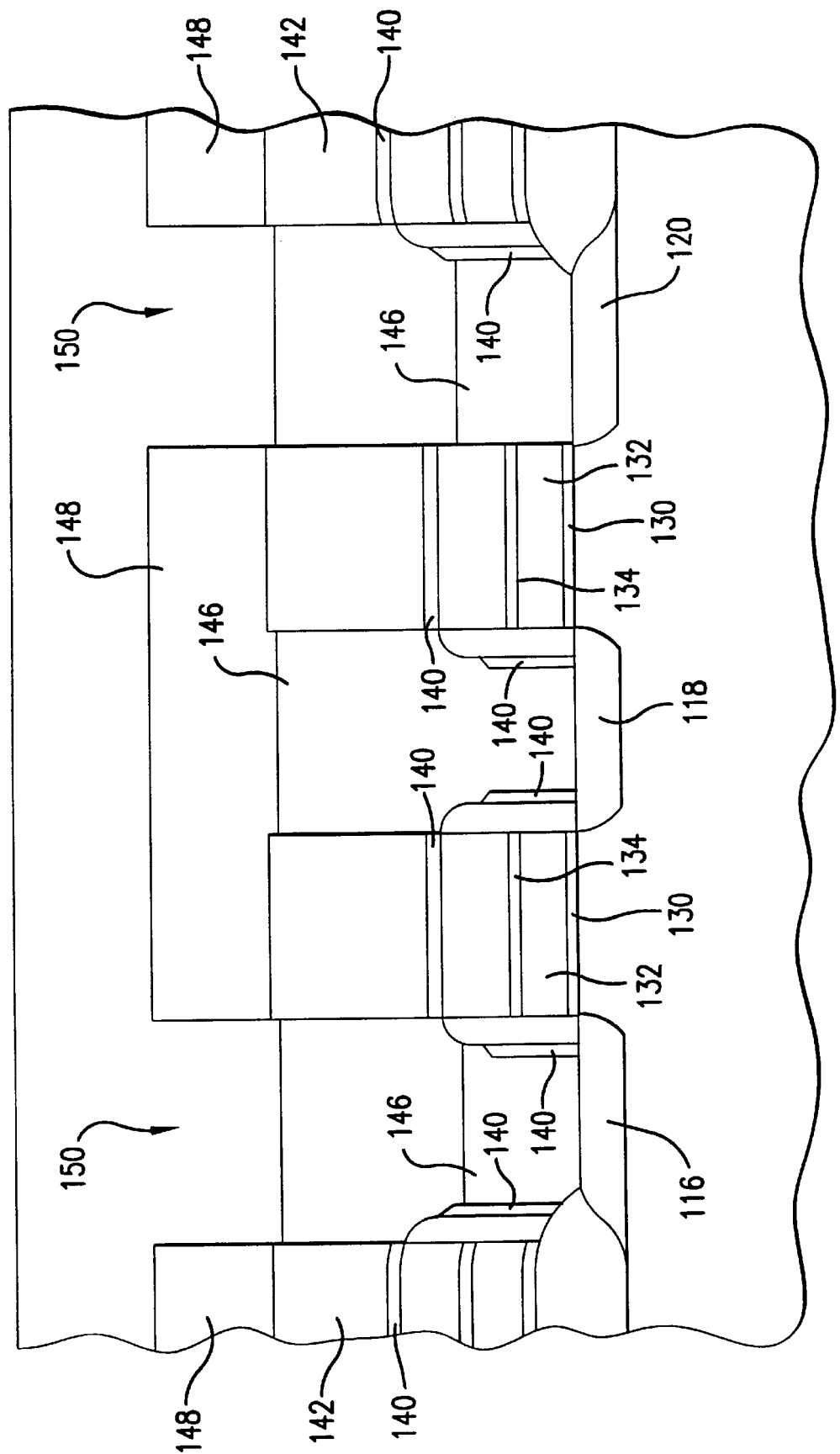
FIG. 10 is a diagrammatic cross-sectional view of a portion of a semiconductor wafer at a processing step subsequent to that shown in FIG. 9.

Referring now to FIG. 10, capacitor openings 150 are then formed in the BPSG layer 148 by photomasking and dry chemical etching. The height of the plugs, as defined by the conductive plug layer 146 over the non-bit line active areas 116, 120 is also reduced by this step.

Figure 11:
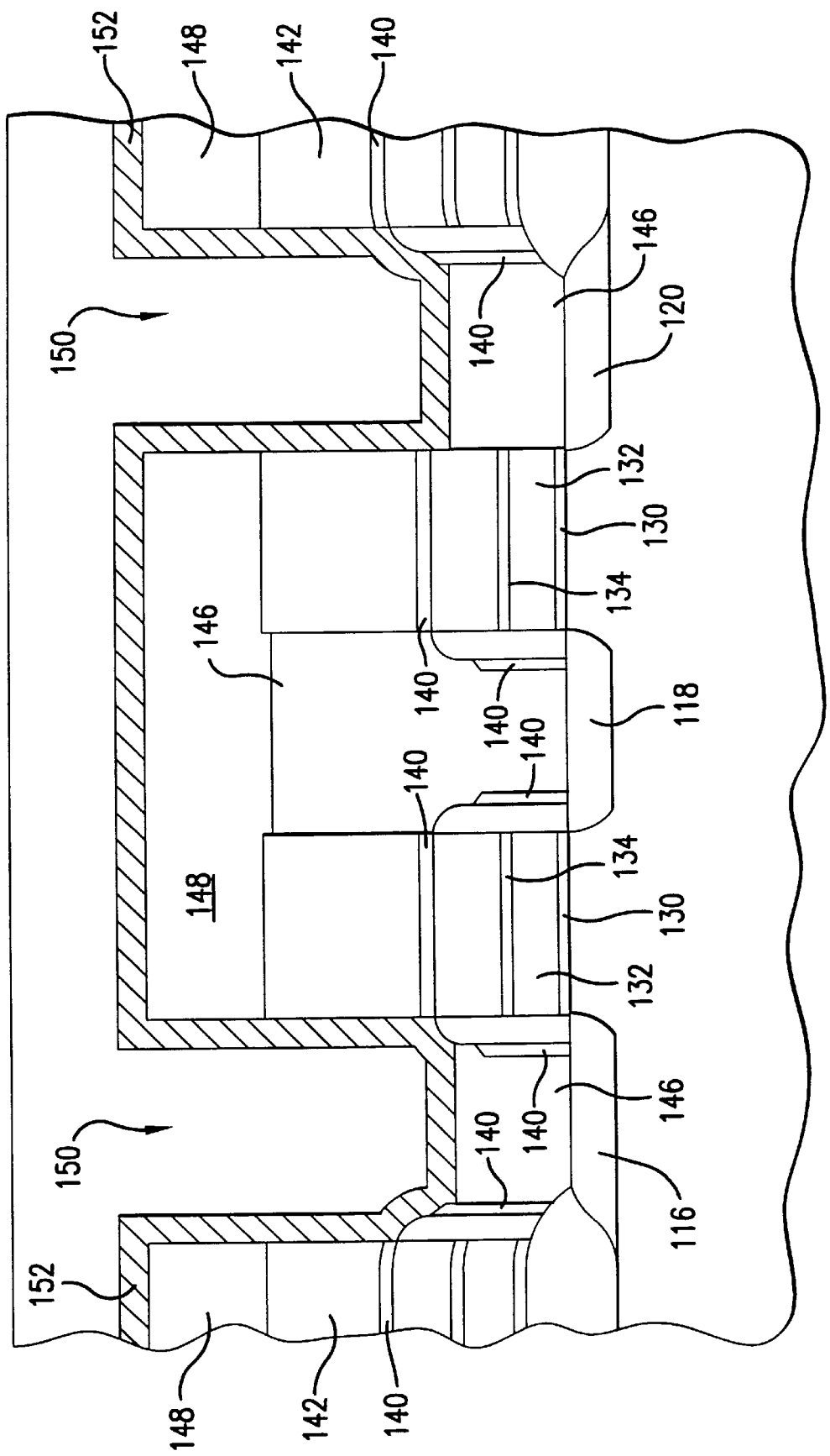
FIG. 11 is a diagrammatic cross-sectional view of a portion of a semiconductor wafer at a processing step subsequent to that shown in FIG. 10.

Referring now to FIG. 11, a layer 152 of conductive material that will eventually form the storage node (lower electrode) of the capacitor is deposited at a thickness such that the capacitor openings 150 are not closed off. The layer 152 may be formed of hemispherical grained poly (HSG) to increase capacitance. If HSG poly is used, the layer 152 may be formed by first depositing a layer of in situ doped polysilicon followed by a deposition of undoped HSG. Subsequent heating inherent in wafer processing will effectively conductively dope the overlying HSG layer. Alternatively, the conductive layer 152 may be provided by in situ arsenic doping of an entire HSG layer. The conductive layer 152 is in electrical contact with the previously formed plugs 146 over the non-bit line active areas 116, 120 and may, if desired, also be in electrical contact with the appropriate wordline in those cells designated ROM. Depending upon the height of the plug 146 over active area 120, the conductive layer 152 may also be in contact with lower poly layer 132 and silicide layer 134 of the non-spacered wordline.

Figure 12:
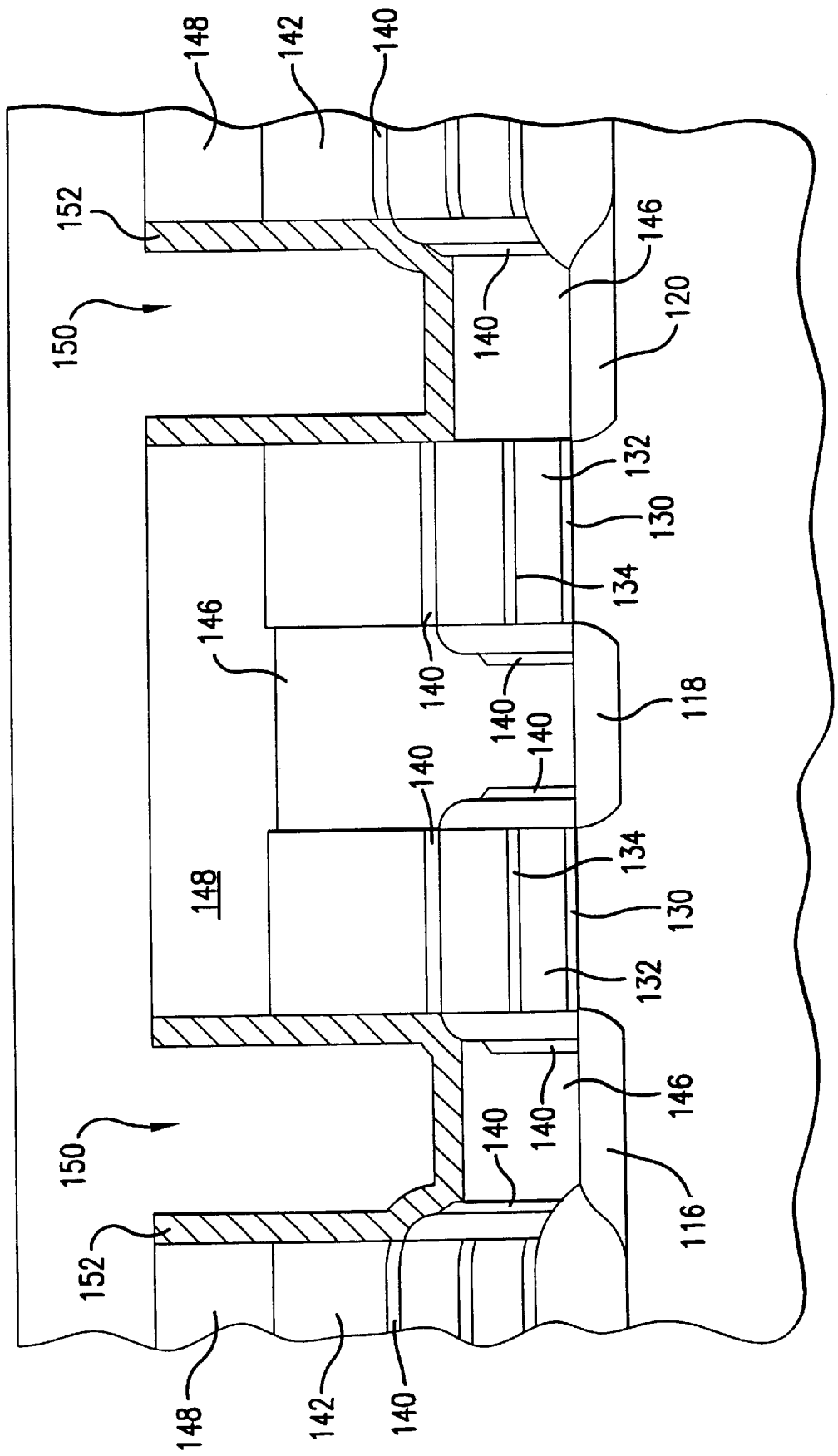
FIG. 12 is a diagrammatic cross-sectional view of a portion of a semiconductor wafer at a processing step subsequent to that shown in FIG. 11.

Referring now to FIG. 12, the portion of the conductive layer 152 above the top of the second BPSG layer 148 is removed through a CMP or planarized etching process.

Figure 13:
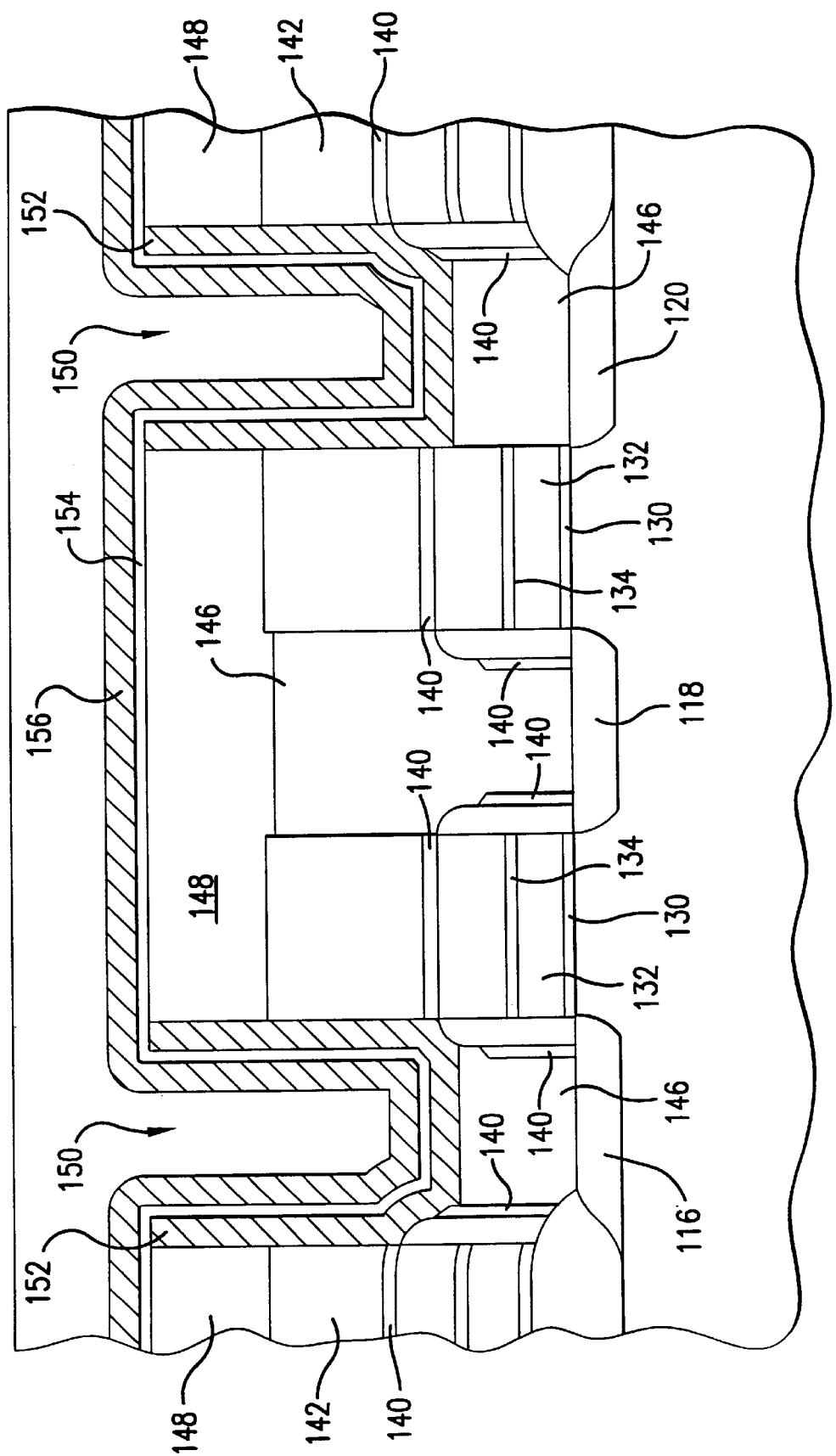
FIG. 13 is a diagrammatic cross-sectional view of a portion of a semiconductor wafer at a processing step subsequent to that shown in FIG. 12.

Referring now to FIG. 13, a capacitor dielectric layer 154 is provided over the second BPSG layer 148 and over the conductive layer 152 within the capacitor openings 150. The dielectric layer 154 is deposited with a thickness such that the capacitor openings 150 are again not completely filled. The dielectric layer 154 may comprise a $Ta_2O_5$ or oxide-nitride-oxide (ONO) dielectric, although other materials are of course possible. A second conductive layer 156 is deposited over the dielectric layer 154, again at a thickness which less than completely fills the bit line contact and capacitor openings 144, 146. The second conductive layer 156 is preferably composed of poly. In addition to serving as a second plate of the capacitor, the second conductive layer 156 also forms the interconnection lines between the second plates of capacitors. The second plate is the plate of the capacitor that is connected to the reference voltage as discussed above.

Figure 14:
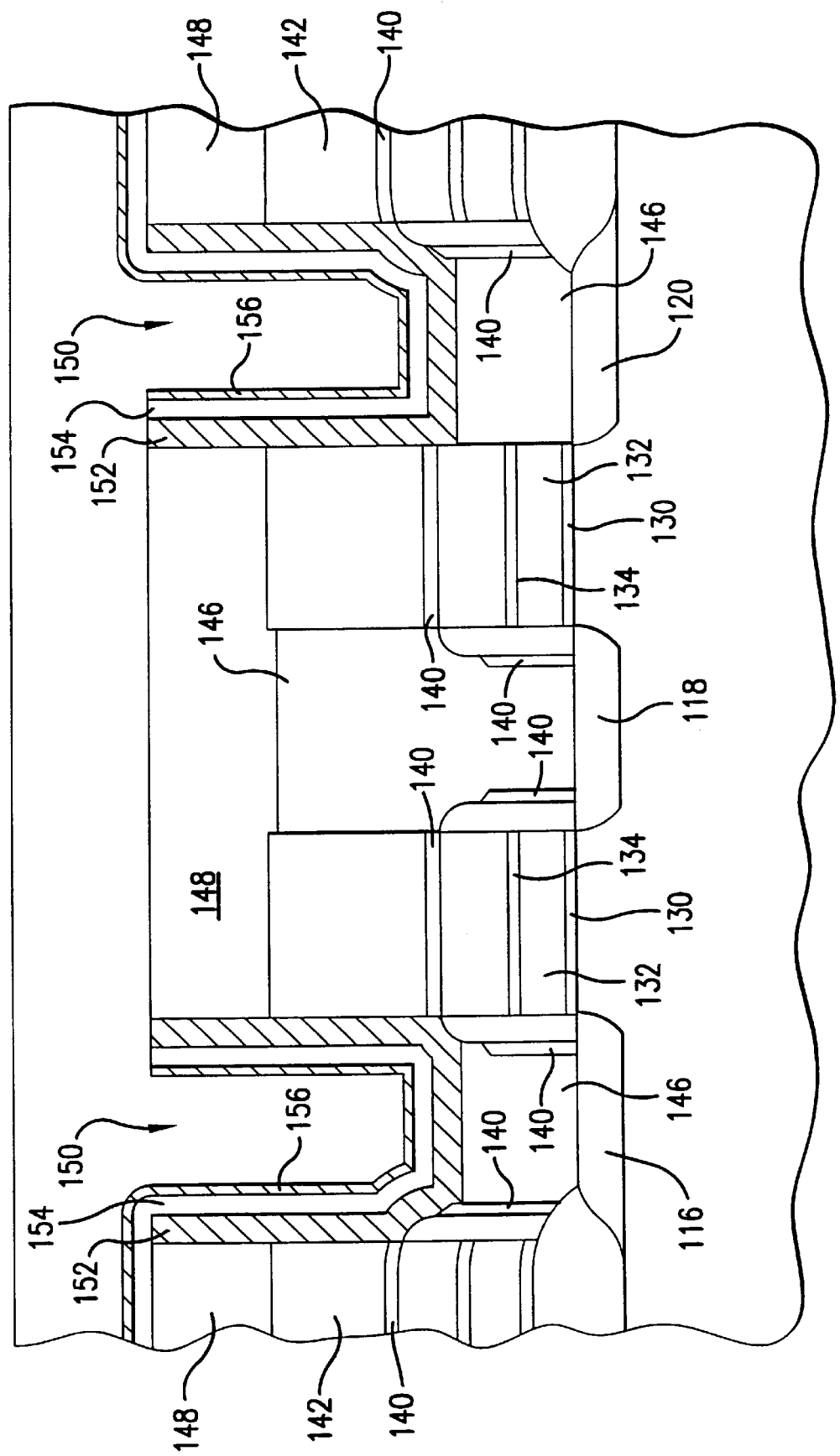
FIG. 14 is a diagrammatic cross-sectional view of a portion of a semiconductor wafer at a processing step subsequent to that shown in FIG. 13.

Referring now to FIG. 14, the second conductive layer 156 and underlying capacitor dielectric layer 154 are patterned and etched. In this manner, active areas 116 and 118 are electrically isolated (without the influence of the gate).

Figure 15:
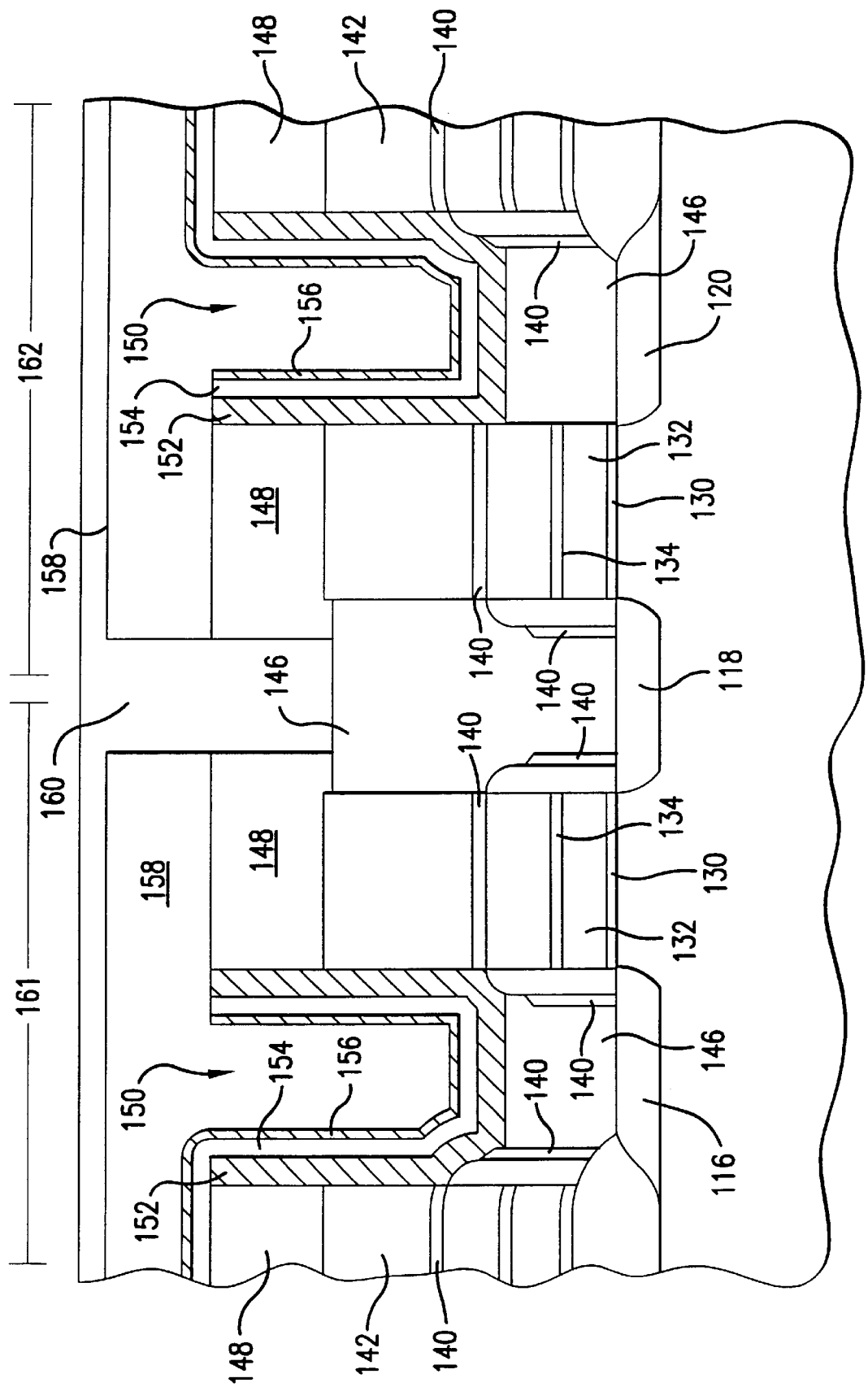
FIG. 15 is a diagrammatic cross-sectional view of a portion of a semiconductor wafer at a processing step subsequent to that shown in FIG. 14.

Referring now to FIG. 15, a bit line insulating layer 158 is provided over the second conductive layer 156 and the second BPSG layer 148. The bit line insulating layer 158 may be comprised of BPSG. A bit line contact opening 160 is patterned through the bit line insulating layer 158 such that the conductive plug 146 is once again outwardly exposed. Then a bit line contact is provided in the bit line contact opening 160 such that the bit line contact is in electrical contact with the outwardly exposed portion of the plug 146. Thus, the outwardly exposed portion of the plug 146 over the active area 118 acts as a bit line contact to ROM cell 162 and DRAM cell 161.

Figure 16:
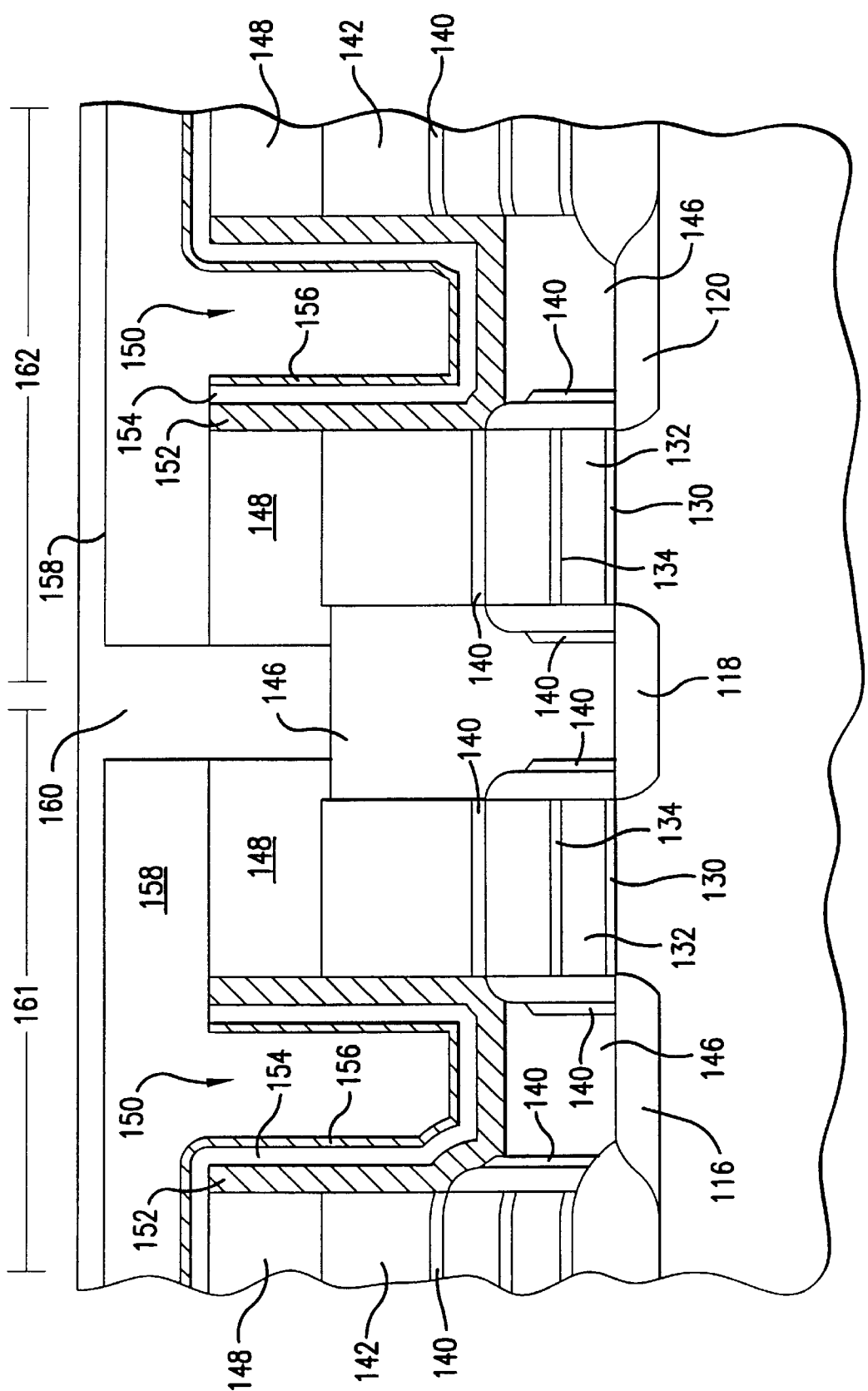
FIG. 16 is a diagrammatic cross-sectional view of a portion of a semiconductor wafer of another embodiment at the processing step shown in FIG. 15.
Figure 17:
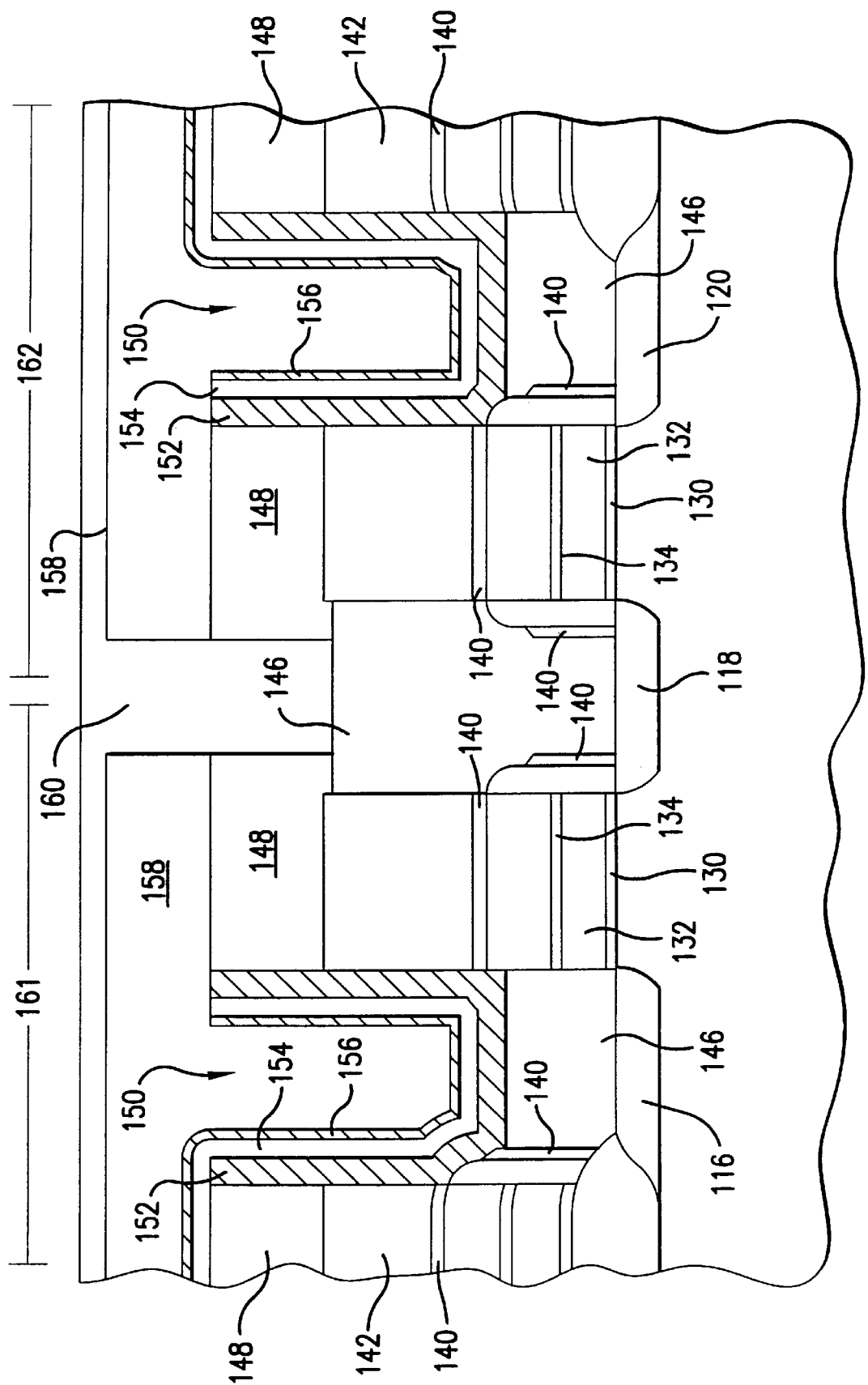
FIG. 17 is a diagrammatic cross-sectional view of a portion of a semiconductor wafer of another embodiment at the processing step shown in FIG. 15.
Figure 18:
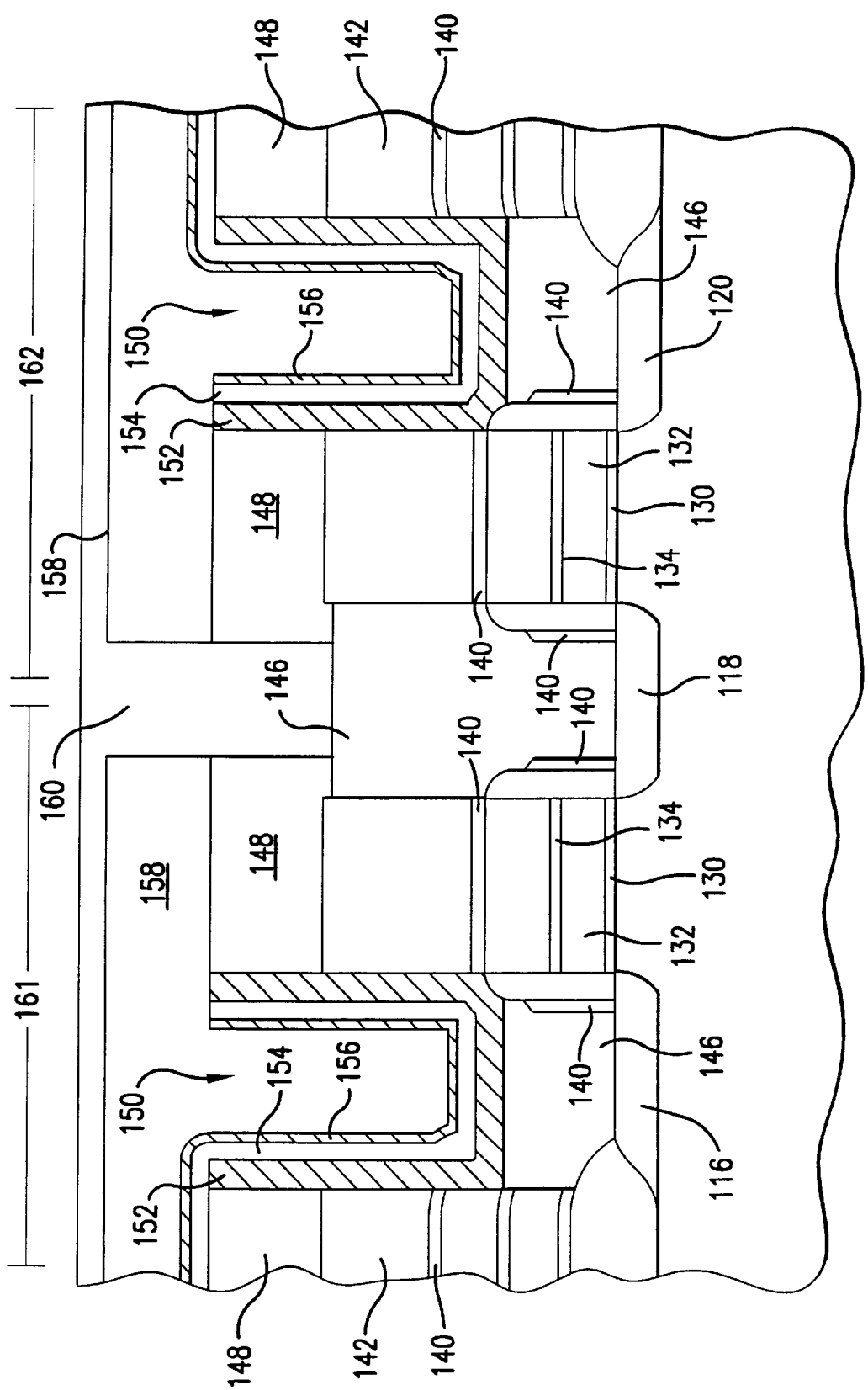
FIG. 18 is a diagrammatic cross-sectional view of a portion of a semiconductor wafer of another embodiment at the processing step shown in FIG. 15.

Thus, a ROM-embedded-DRAM is provided with a stacked capacitor having a short circuit to the ROM cell wordline or to an adjacent cell's wordline. Various other capacitor structures and fabrication steps may be employed to form capacitors shorted to wordlines to form ROM cells. For example, whereas FIG. 15 shows a ROM-embedded-DRAM wherein cell 161 is a DRAM cell and cell 162 is a read-only "1", other ROM programming can also be conducted by shifting one mask to one side or the other as shown in FIGS. 16–18. In FIG. 16, cell 161 is a DRAM cell and cell 162 is programmed as a read-only "0"; in FIG. 17, cell 161 is a read-only "1" and cell 162 is a read-only "0"; in FIG. 18, both cells are programmed as read-only "0" cells. Any desired configuration of the ROM-embedded-DRAM according to the invention can be achieved given the teachings herein. Although the process was depicted with reference to a stacked container capacitor process flow, it may be easily adapted to a process utilizing block, trench, double cylindrical, crown shaped, ring or vertical fin capacitors, as shown for example in U.S. Pat. No. 5,270,241. Such ROM-embedded-DRAM memory cells and arrays can be constructed in accordance with known processing techniques by one of ordinary skill in the art, given the ROM-embedded-DRAM structures and processing techniques taught herein.

The array may then be completed using processing techniques that are well known in the art, including opening holes in the overlaying insulator glass to the polysilicon periphery plugs, metalizing the holes via tungston plugs or aluminum force fill, and then patterning and etching conductive lines on the surface to form local interconnects. Although only preferred embodiments of the process have been disclosed herein, it will be obvious to those having ordinary skill in the art that changes and modifications may be made to the process without departing from the scope and spirit of the invention as claimed. For example, the process of the invention may be performed to fabricate arrays having straight-line, as opposed to the S-shaped, active areas shown in FIG. 4. Similarly, other dielectric materials such as silicon dioxide, titanium oxide, yttrium oxide, barium strontium titanate, combinations of these, and others, may be used for dielectric 154, and other insulating materials, such as the above and various other oxides, may be substituted for the BPSG of layer 142. Additionally, materials other than HSG or CHSG (e.g., cylindrical grain poly (CGP)) may be substituted for rugged polysilicon layer.

Figure 19:
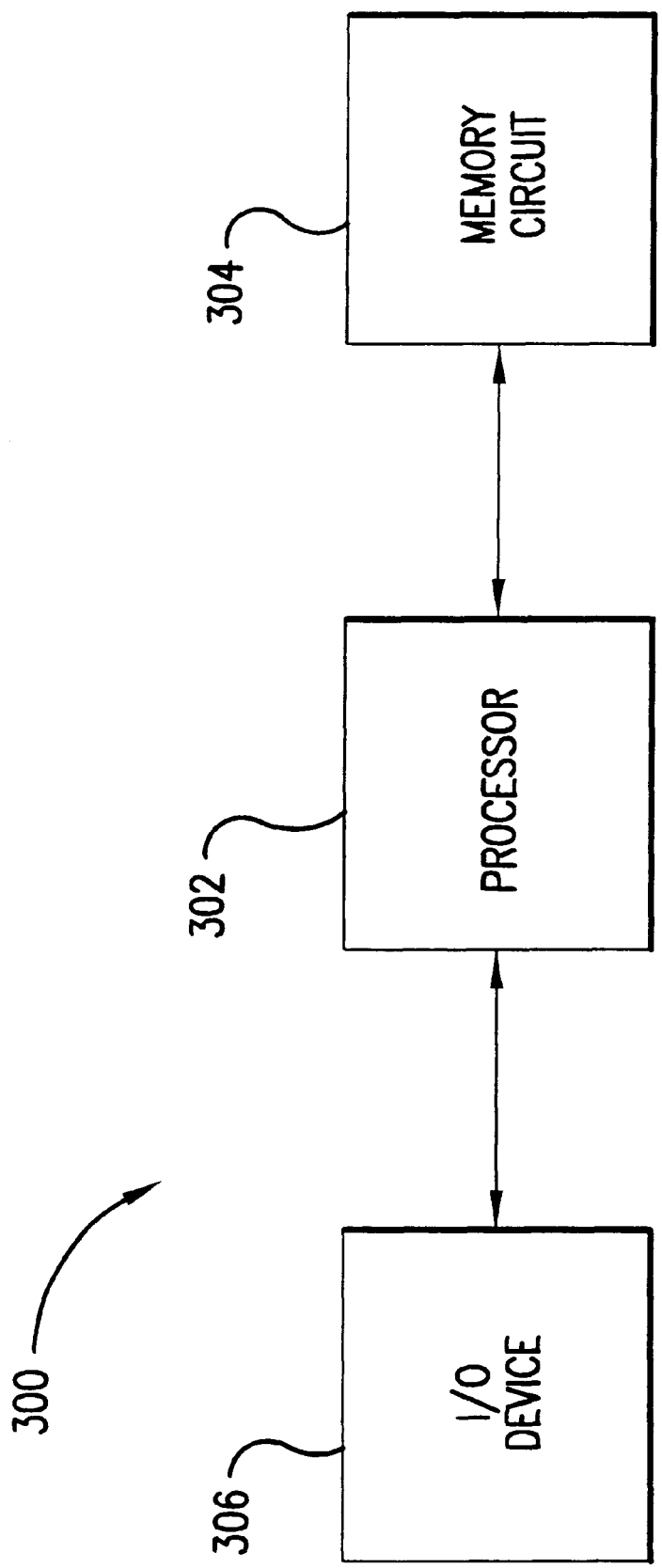
FIG. 19 is a block diagram of a computer system comprising a memory including a ROM-embedded-DRAM.

FIG. 19 illustrates a computer system 300 according to one embodiment of the present invention. The computer system 300 comprises a CPU (central processing unit) 302, a memory circuit 304, and an I/O (input/output) device 306. The memory circuit 304 contains a DRAM memory circuit including the ROM-embedded-DRAM cells according to the present invention. Memory other than DRAM may be used. Also, the CPU itself may be an integrated processor which utilizes ROM-embedded-DRAM cells, or all or a portion of the CPU 302 may be provided as ROM-embedded-DRAM within the memory circuit 304.

The above description and accompanying drawings are only illustrative of preferred embodiments which can achieve and provide the objects, features and advantages of the present invention.

What is claimed as new and desired to be protected by Letters Patent of the United States is:

1. A method of forming a ROM memory cell comprising the steps of:

providing a silicon semiconductor substrate having a wordline and an active area;

providing a bit line in electrical contact with said active area on one side of said wordline; and providing a capacitor that is always in electrical contact with the other side of said wordline.

2. The method of claim 1 further comprising providing a capacitor contact plug in electrical contact with said active area on the non-bit line side of said wordline.

3. The method of claim 1 further comprising providing insulating spacers on said wordline and removing one of said spacers to permit electrical contact between said capacitor and wordline.

4. The method of claim 3 wherein said one of said spacers has a width and said step of removing said one of said spacers utilizes a mask to define a capacitor opening and comprises shifting the mask for the capacitor opening by at least the width of said one of said spacers in a direction toward said wordline and then etching said spacer so that said other side of said wordline is exposed.

5. A method of forming a ROM-embedded-DRAM memory circuit comprising the steps of:

providing a silicon semiconductor substrate having a word line and an active area;

providing a first insulating material layer over the word line and active area;

opening a first contact hole through the first insulating layer to a first contact location of the active area;

opening a second contact hole through the first insulating layer to a second contact location on one side of the wordline;

providing a first conductive material layer over the first insulating material and within the first and second contact holes;

removing a portion of the first conductive material layer to expose an outward surface of the conductive material at an elevation below the elevation of the outward surface of the first insulating material to form a bit line contact above the first contact location and a capacitor storage node contact at the second contact location wherein said storage node contact is always in electrical connection with said wordline.

6. The method of claim 5 further comprising providing a capacitor in electrical communication with the capacitor storage node contact.

7. The method of claim 6 further comprising providing a conductive material plug between said capacitor storage node and said wordline.

8. The method of claim 6 wherein the step of providing a capacitor comprises providing a container capacitor.

9. The method of claim 6 further comprising the step of providing a bit line above said capacitor.

10. A method of forming a ROM-embedded-DRAM memory circuit comprising the steps of:
providing an array of substantially electrically isolated word lines atop a semiconductor wafer;
providing active areas about the word lines to define an array of memory cell field effect transistors, the active areas being defined by a first and second active region for electrical connection with a memory cell capacitor and a third active region for electrical connection with a bit line;
providing a first layer of electrically insulating material over the word lines and active regions, the layer of insulating material having an uppermost surface which is above the word lines;
providing first and second respective contact openings through the first insulating material layer to the active regions, at least one of said openings removing at least a portion of insulating material from at least one of said wordlines;
providing a first layer of electrically conductive material over the first insulating material and within the contact openings, wherein said conductive material is in electrical contact with said at least one of said wordlines.

11. The method of claim 10 wherein the step of providing first and second contact openings comprises applying a single photomask to pattern contact openings for both a DRAM cell and a ROM cell.

12. The method of claim 11 further comprising the step of etching said insulating material with a non-selective etch.

13. The method of claim 10 wherein the step of removing a portion of the first electrically conductive material provides a patterned bit line contact in electrical communication with the second active region, and providing a conductive capacitor plug in electrical communication with the first active region and said wordline.

14. The method of claim 10 wherein the step of removing a portion of insulating material comprises removing spacering material from one side of said at least one wordline.

15. The method of claim 10 wherein at least some of said first and second contact openings are formed by two separate masking steps.

16. The method of claim 10 wherein selection of said at least one side of said wordline for removal of insulating material is determined by the programming requirements for said ROM.

* * * * *